United States Patent
Mauder et al.

(10) Patent No.: US 7,939,850 B2
(45) Date of Patent: May 10, 2011

(54) SEMICONDUCTOR DEVICE AND METHOD FOR PRODUCING A SEMICONDUCTOR DEVICE

(75) Inventors: Anton Mauder, Kolbermoor (DE); Giulliano Aloise, Villach (AT)

(73) Assignee: Infineon Technologies Austria AG, Villach (AT)

( * ) Notice: Subject to any disclaimer, the term of this patent is extended or adjusted under 35 U.S.C. 154(b) by 28 days.

(21) Appl. No.: 12/403,100

(22) Filed: Mar. 12, 2009

(65) Prior Publication Data
US 2010/0230715 A1    Sep. 16, 2010

(51) Int. Cl.
*H01L 29/74* (2006.01)
(52) U.S. Cl. .................... 257/139; 257/107; 257/133
(58) Field of Classification Search .............. 257/139, 257/107, 133
See application file for complete search history.

(56) References Cited

U.S. PATENT DOCUMENTS

| 6,551,909 B1* | 4/2003 | Fujihira .................... 438/510 |
| 2003/0207536 A1* | 11/2003 | Miyasaka et al. ............. 438/268 |
| 2004/0084724 A1* | 5/2004 | Kapels et al. ................. 257/330 |

FOREIGN PATENT DOCUMENTS
DE   10031461   1/2002

* cited by examiner

*Primary Examiner* — Long Pham
(74) *Attorney, Agent, or Firm* — Dicke, Billig & Czaja, P.L.L.C.

(57) ABSTRACT

A semiconductor device has a semiconductor body with a semiconductor device structure including at least a first electrode and a second electrode. Between the two electrodes, a drift region is arranged, the drift region including charge compensation zones and drift zones arranged substantially parallel to one another. At least one charge carrier storage region which is at least partially free of charge compensation zones is arranged in the semiconductor body.

15 Claims, 7 Drawing Sheets

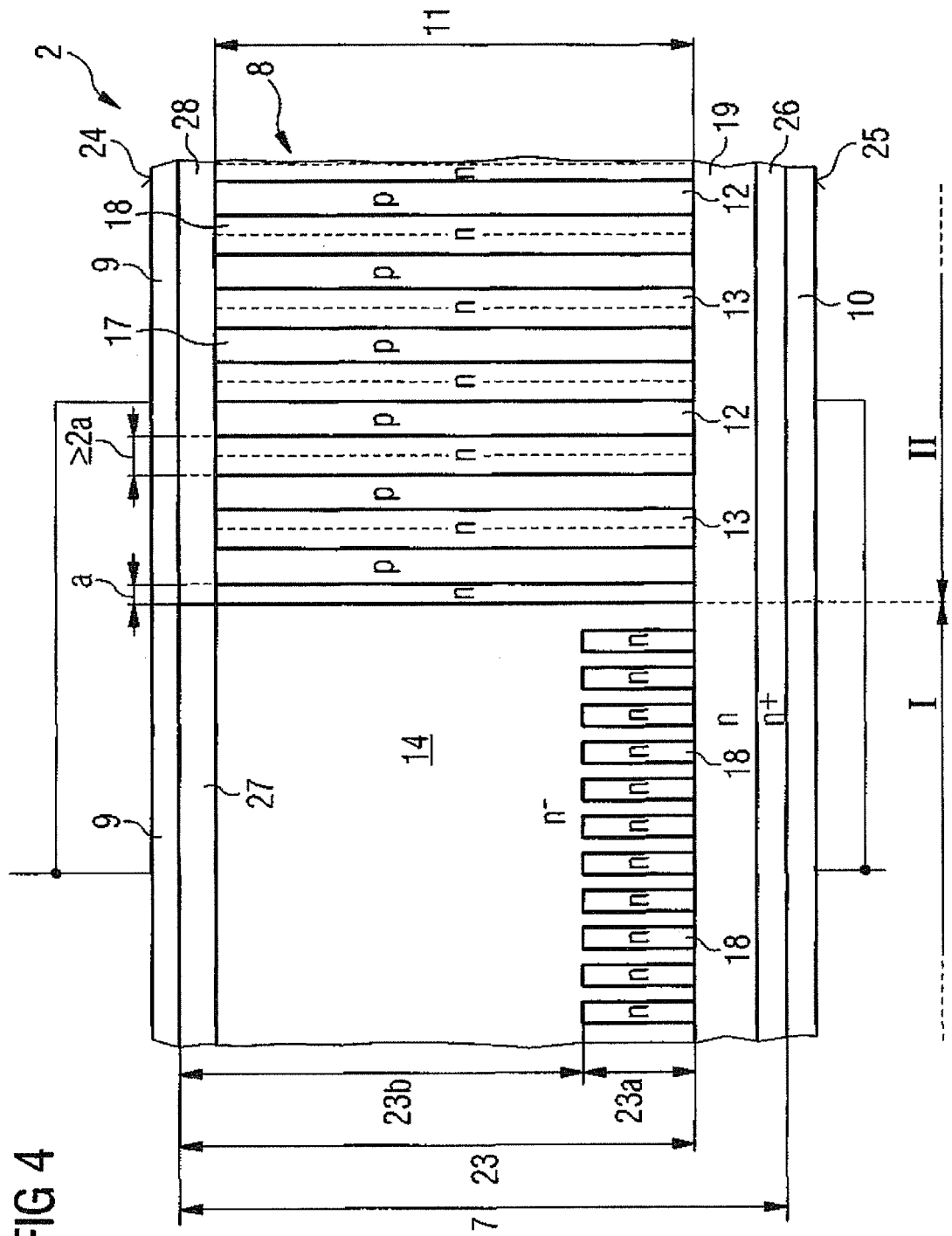

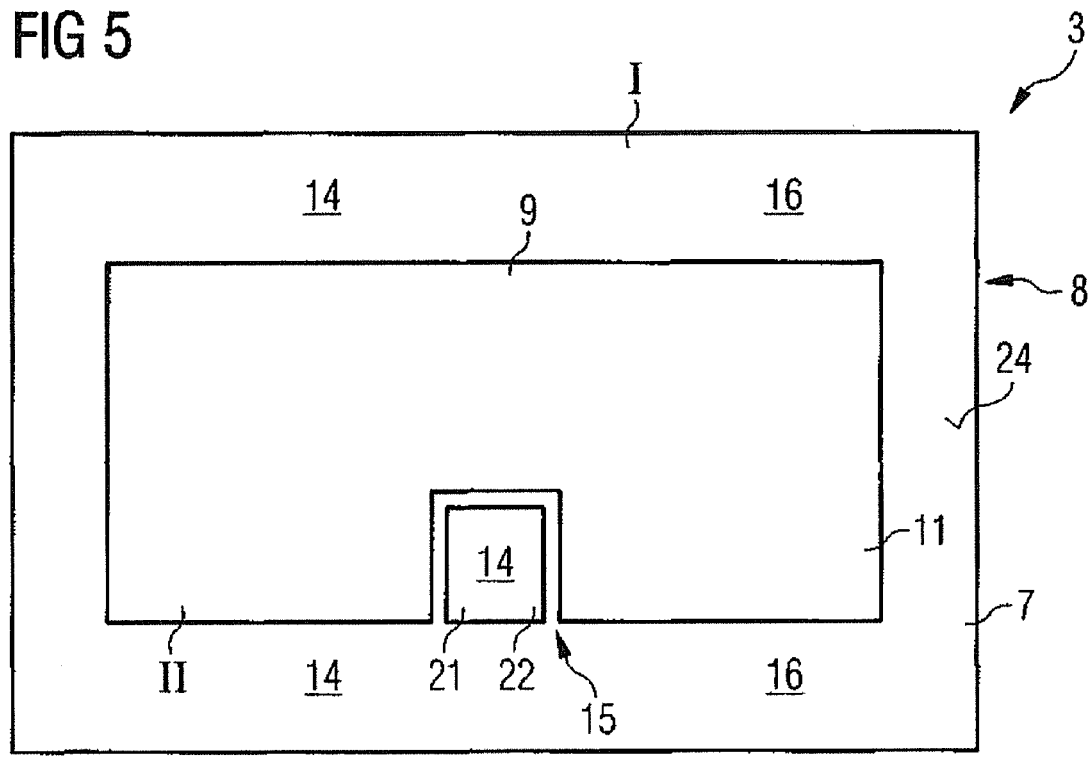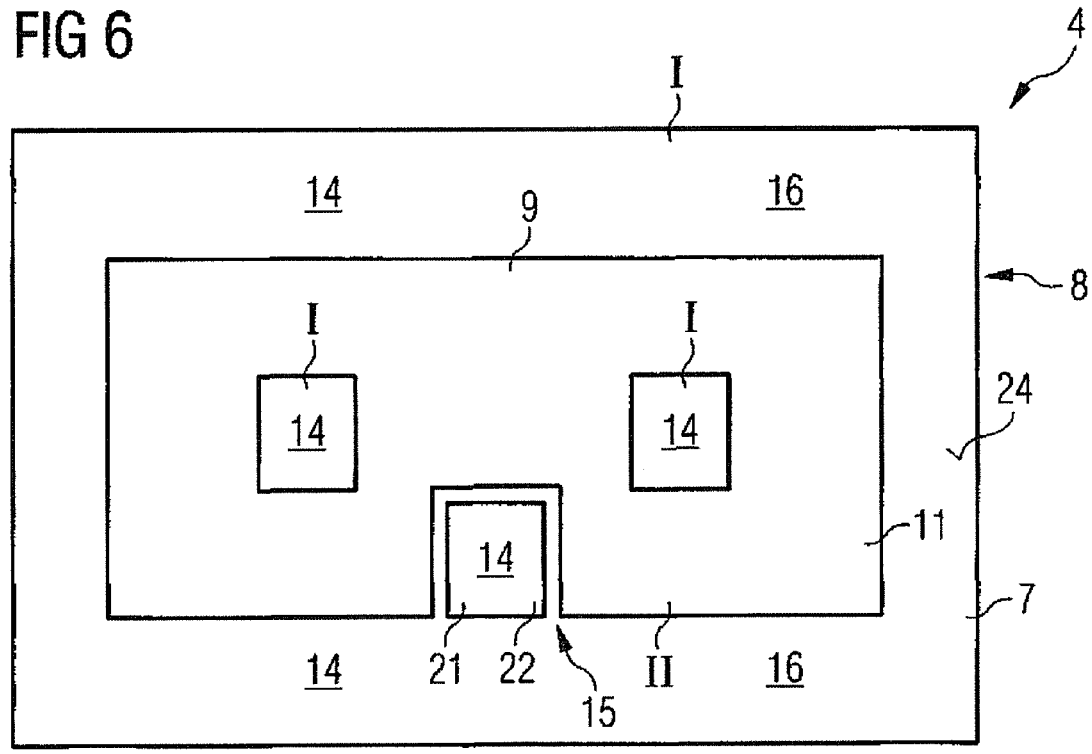

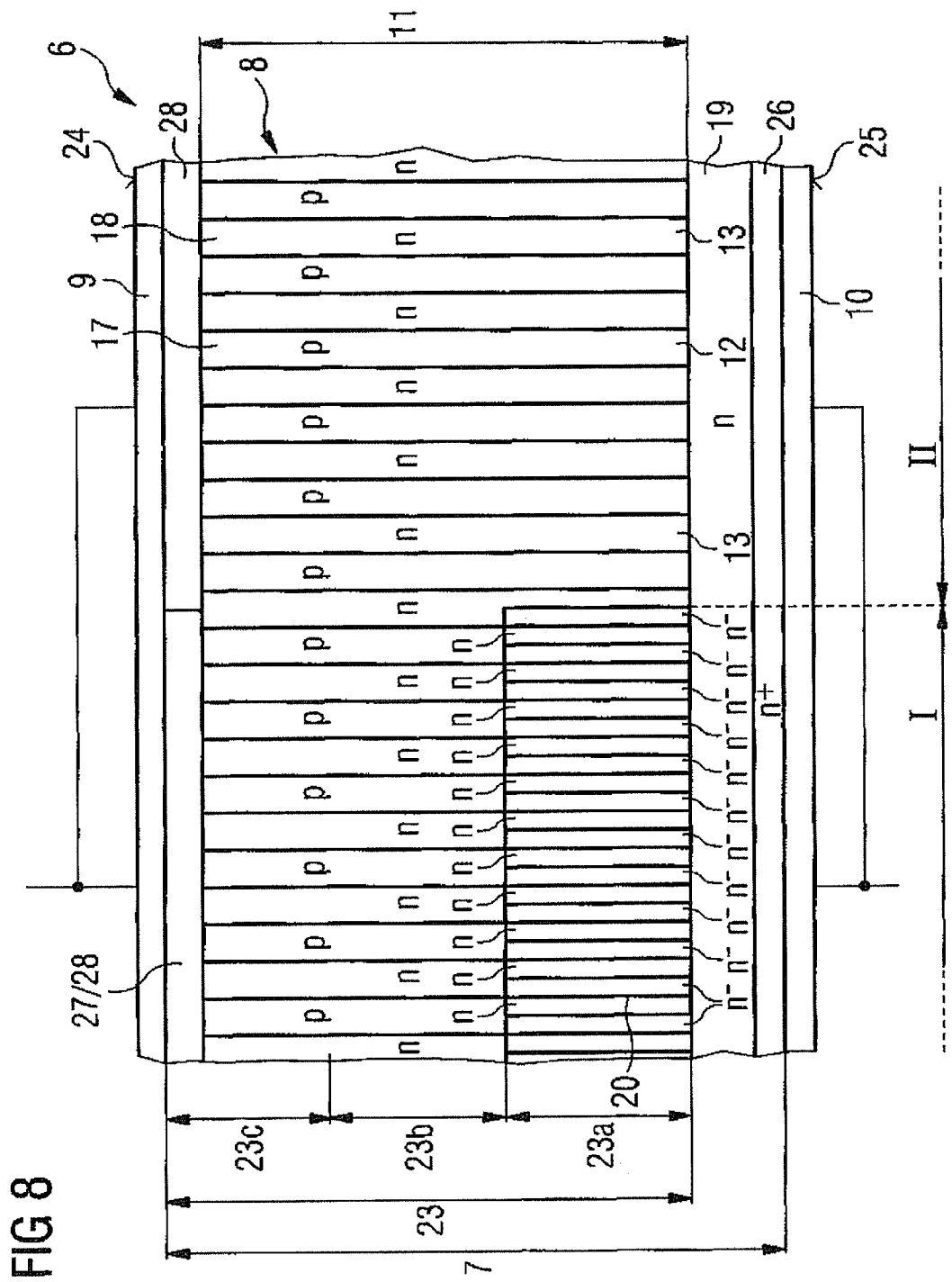

SEMICONDUCTOR DEVICE AND METHOD FOR PRODUCING A SEMICONDUCTOR DEVICE

BACKGROUND

The application relates to a semiconductor device and to a method for producing a semiconductor device. The semiconductor device includes a semiconductor body with a semiconductor device structure including at least a first and a second electrode. Between the two electrodes, a drift region is arranged, the drift region including charge compensation zones and drift zones arranged substantially parallel to one another.

Such semiconductor devices are known under the generic designation of compensation semiconductor devices and are characterized by a relatively low on-state resistance based on the higher doping of the drift zones in the drift region, which is made possible by the parallel arrangement of charge compensation zones with complementary doping. For certain applications, such as zero voltage switching (ZVS) resonance converters, a high switching speed of the body diode is desirable in such compensation semiconductor devices, e.g. the CoolMOS, in order to avoid the destruction of the device at low applied loads or in particular fault conditions of such a converter.

This requires the controlled, effective and stable reduction of carrier flooding in the diode operation mode in such compensation semiconductor devices. If the compensation semiconductor device is optimized to a minimum on-state resistance $R_{on} \cdot A$, the field distribution in the de-commutation process of the semiconductor device is such that an interruption of the diode reverse current cannot be avoided. One cause for this lies in the fact that the whole semiconductor region between the compensation columns lies in a depletion region even at very low voltages between source and drain, with the result that no flood charges are available in the device even in an early stage of a diode commutation.

The diode reverse current is therefore interrupted abruptly, leading to high voltage peaks up to oscillations and thus to the possibility of a premature destruction of the device. This happens primarily in a fast de-commutation process of the body diode of a compensation semiconductor device. The better the compensation, i.e. the higher the doping level and the less the distance between the columns, the more violent will be the interruption. Compensation semiconductor devices optimized as MOS switches are therefore not suitable for use as fast recovery epitaxial diode field effect transistors (FREDFET) if the focus of the application lies on the switching behavior of the diode.

The switching behavior can be improved slightly for fast commutation by reducing the lifetime of the charge carriers. There is however a limit to the level of the flood charges available for the adjustment of switching behavior. A further method for the improvement of the switching behavior of a ZVS (zero voltage switching) resonance converter is to delay the switching transistor in its switch-on behavior. This is achieved by switching on the transistor with a relatively high series resistance, resulting in a correspondingly small current change in the diode commutation process. Such a series resistance, however, causes undesirably high dynamic losses.

SUMMARY

An embodiment relates to a semiconductor device and to a method for producing a semiconductor device. The semiconductor device includes a semiconductor body with a semiconductor device structure including at least a first and a second electrode. Between the two electrodes, a drift region is arranged, the drift region including charge compensation zones and drift zones arranged substantially parallel to one another. At least one charge carrier storage region which is at least partially free of charge compensation zones is arranged in the semiconductor body.

In this embodiment, the performance of the compensation semiconductor device is intentionally reduced in order to hold stored charge carriers up to the end of the commutation process in certain charge carrier storage regions of the semiconductor device, the stored charge carriers providing a soft switching behavior.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 4 illustrates a diagrammatical vertical section through a semiconductor device.

FIG. 5 illustrates a diagrammatical top view of a semiconductor device.

FIG. 6 illustrates a diagrammatical top view of a semiconductor device.

FIG. 8 illustrates a vertical section through a semiconductor device.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
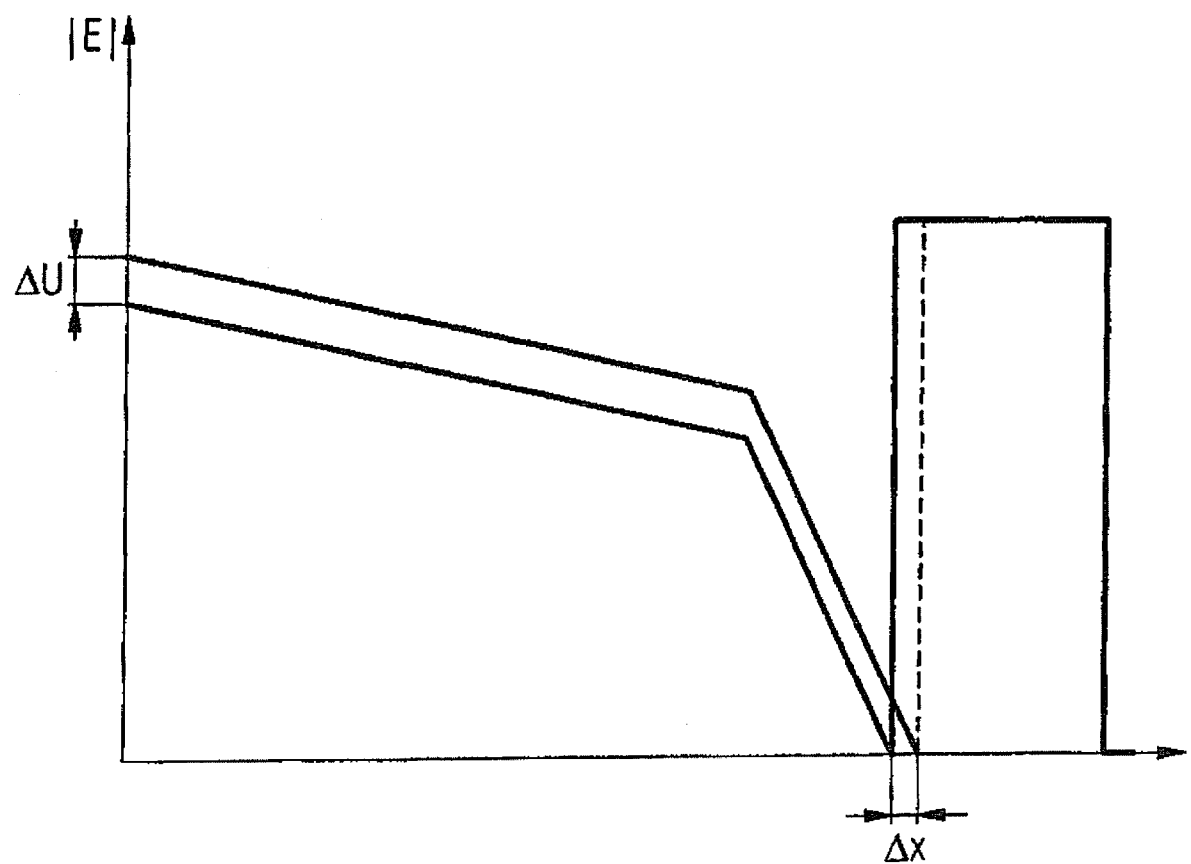
FIG. 1 illustrates a schematic diagram relating to the requirement of a soft switching behavior of a compensation semiconductor device.

FIG. 1 illustrates a schematic diagram relating to the requirement of a soft switching behavior of a compensation semiconductor device. The spread of the depletion region in the vertical direction x is plotted on the abscissa, while the absolute value of the field strength E is plotted on the ordinate. The region of a held flood charge is symbolically represented for a charge carrier storage region by a rectangle in FIG. 1. As long as the depletion region has to remove the flood charge carriers of the charge carrier storage region over a distance $\Delta x$ in order to build up the blocking voltage by the amount $\Delta U$, a reverse current interruption and thus an extremely steep increase of the blocking voltage at the device may be prevented. A removal of an amount of charge carriers over the distance $\Delta x$ as illustrated diagrammatically in FIG. 1 via the flowing reverse current requires a finite time. The voltage increase is delayed by holding a charge carrier storage region in the charge compensation device. The charge carrier storage region is essentially free of charge compensation zones.

Different embodiments are described below for holding sufficiently long flood charges in a compensation semiconductor device for the commutation process, in order to reduce or prevent an interruption of the reverse current in the commutation process.

Figure 2:
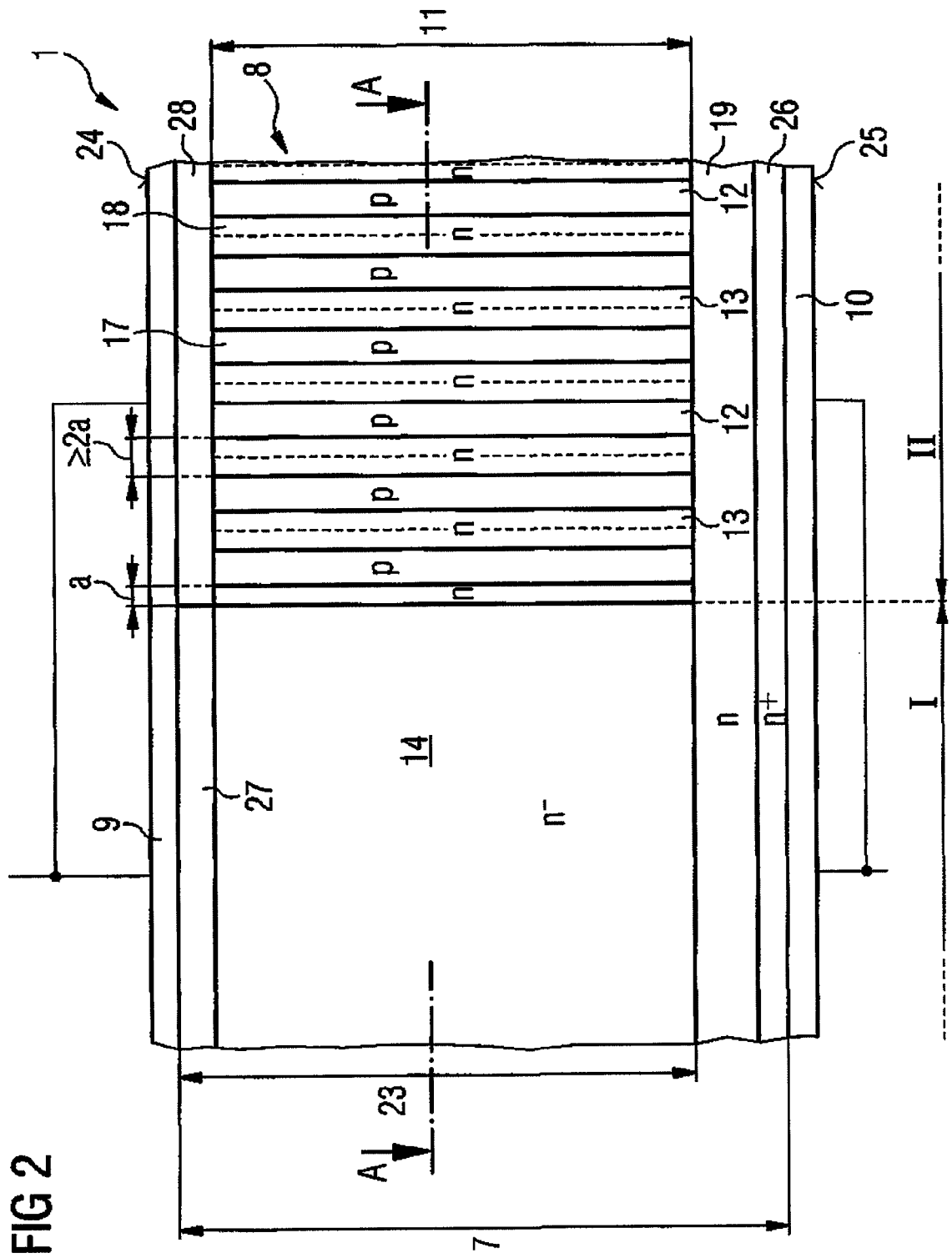
FIG. 2 illustrates a diagrammatical vertical section through a semiconductor device.
Figure 3:
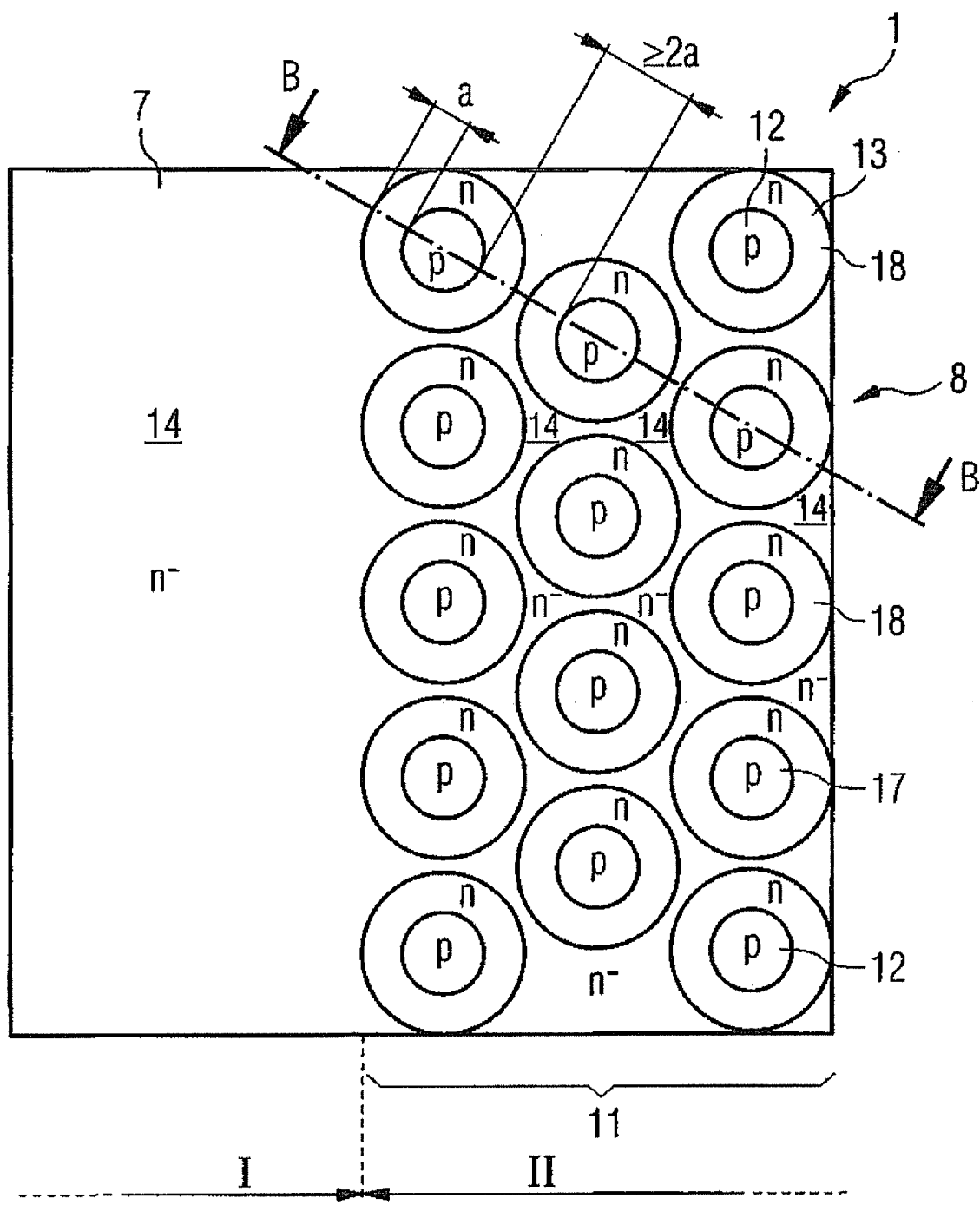
FIG. 3 illustrates a diagrammatical horizontal section through the semiconductor device according to FIG. 2.

FIG. 2 illustrates a diagrammatical vertical section through a semiconductor device 1 along a line B-B shown in FIG. 3. The semiconductor device 1 includes a semiconductor body 7 with a semiconductor device structure 8 including at least a first electrode 9 and a second electrode 10. The first electrode 9 may be an anode in a diode or a source electrode in a transistor. The second electrode 10 may be a cathode for a diode or a drain electrode for a transistor.

While the first electrode 9 is arranged on a front-sided surface of the compensation semiconductor device, the second electrode 10 is arranged on a back-sided surface of the semiconductor device. In this embodiment, the second electrode 10 is adjoined by a highly doped substrate 26 and a medium-doped base region 19, which are of the same first conductivity type as drift zones 13 in the semiconductor body 7. This base region 19 is however made of a semiconductor material doped more highly than the net dopant concentration of the drift zones 13 and of charge compensation zones 12. Both the substrate 26 and the base region 19 are optional and may be omitted in other embodiments.

Parallel to the drift zones 13, the charge compensation zones 12 of a second conductivity type complementary to the first conductivity type are arranged, with drift zone columns 18 alternating with charge compensation zone columns 17 placed adjacent to one another in the illustrated embodiment. The semiconductor device 1 further includes a charge carrier storage region 14 of the same conductivity type as the drift zones 13, but having a lower dopant concentration than the drift zones 13. The charge carrier storage region 14 is further doped more lightly than the base region 19. The base region 19 may for example have a dopant concentration which is higher by a factor of approximately five or more than the dopant concentration of the charge carrier storage region 14. This charge carrier storage region 14 is provided not only adjacent to the charge compensation zone columns 17 and the drift zone columns 18, but also between the columns as illustrated in FIG. 3.

Figure 7:
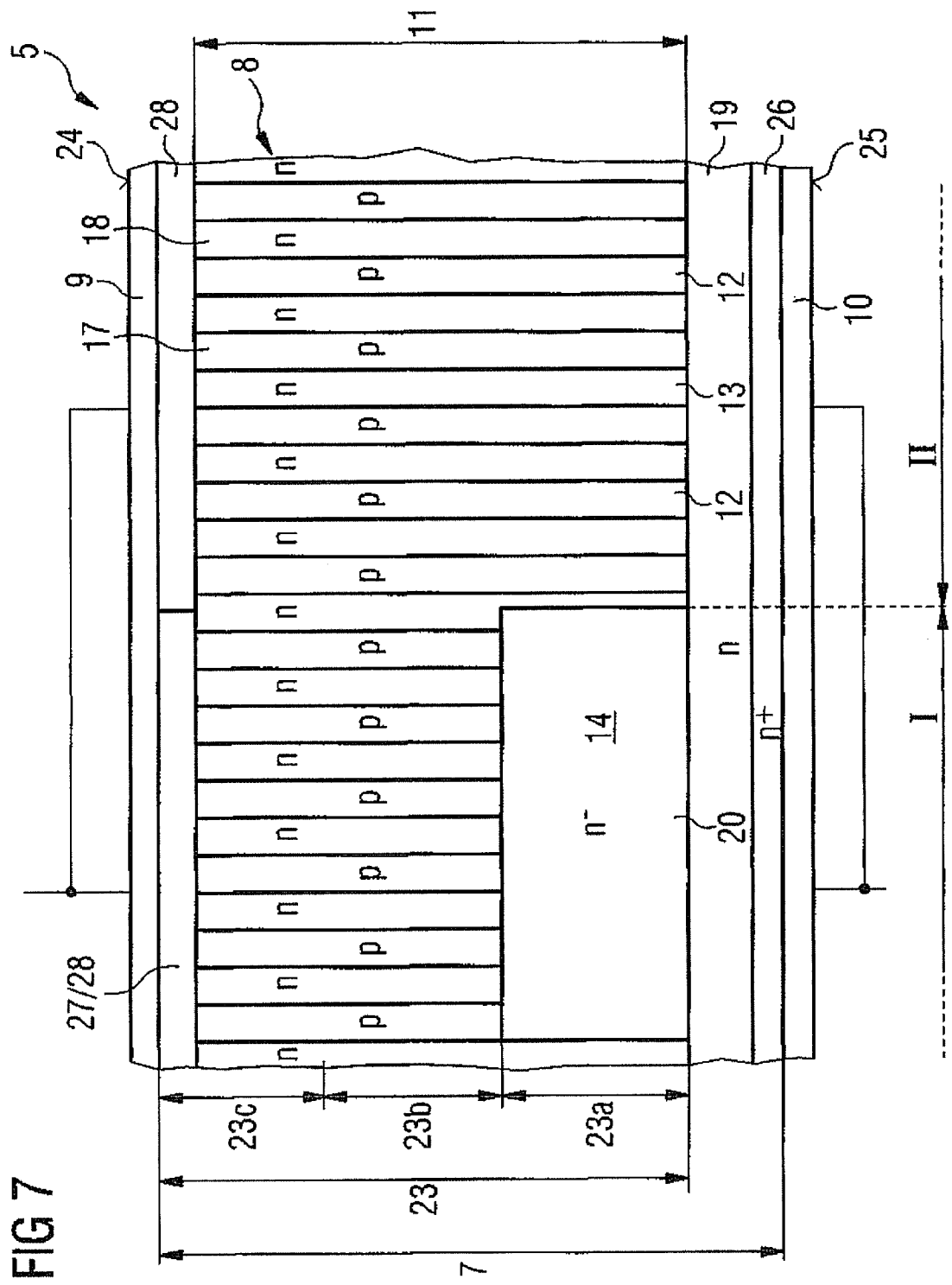
FIG. 7 illustrates a vertical section through a semiconductor device.

In FIG. 2 as well as in FIGS. 4, 7 and 8, certain structures which are arranged in the individual semiconductor devices in a diagrammatically illustrated front-sided cell region 28 or anode region 27, respectively, are not illustrated.

In a MOSFET, the front-sided cell region 28 accommodates at least one gate electrode and a source region of the first conductivity type. The front-sided cell region 28 further accommodates at least one body region of the second conductivity type complementary to the first conductivity type, wherein a channel of the first conductivity type can be provided by biasing the gate electrode, which is galvanically isolated by a gate dielectric, with an appropriate voltage. This region further contains the connection regions associated with the above structures, each with its appropriate connection doping. The front-sided cell region 28 may for example be provided as a planar cell with a planar gate electrode or as a trench cell with a gate electrode arranged in a trench.

The anode region 27 may have a doping of the same conductivity type as the body region, likewise with an adjusted dopant concentration. In one embodiment, the anode region 27 is provided identically to the body region in the front-sided cell region 28. Some or all of the further structures located in the front-sided cell region 28 may be provided in the anode region 27 as well, or they may be omitted. The anode region 27 may therefore be provided either identically to or different from the front-sided cell region 28.

The column-shaped regions of the drift zones 13 and the charge compensation zones 12 are diagrammatically represented as cylinders or strips of constant thickness in the figures. In other embodiments, the thicknesses or the outdiffusion regions of the charge compensation zones 12 and the drift zones 13 may, depending on the production method used, vary over the vertical depth of the semiconductor device.

FIG. 3 illustrates a diagrammatical horizontal section through the semiconductor device 1 according to FIG. 2 along line A-A. While a charge carrier storage region 14 which is at least partially free of charge compensation zone columns is arranged in an edge region, charge compensation zone columns 17 are surrounded by drift zone columns 18 in a cell region, while the interstices contain the lightly doped material of the charge carrier storage region 14. The spacing of the columns may be less or more than twice the size of the outdiffusion region a of the first doping. In some embodiments the spacing of the columns is approximately 2 a as illustrated in FIG. 3.

At a larger spacing, chip area for current transport is lost, and at a smaller spacing the compensation doping has to be reduced. In either case, the optimum on-state resistance may not be reached in the compensation region II. The two doping zones in the compensation region II in FIG. 3 may for example be produced using resist masks to define implantation regions followed by outdiffusion, while the homogeneously doped semiconductor region I in FIG. 3 may be produced using a doped layer deposited epitaxially.

In diode operation mode, both the compensation region II with the charge compensation zones 12 and the drift zones 13 and the homogeneously doped semiconductor region I of the charge carrier storage region 14 are flooded with charge carriers which can be removed in the commutation process. As the regions I and II are connected electrically in parallel, the same voltage is applied in either case. As the compensation region II is depleted already at very low voltages, the homogeneous doping region I determines the voltage increase and the reverse current behavior.

Using the area proportions of the regions I and II, the switching behavior of the device may be adjusted towards soft switching in an appropriate manner. In region I, it is further possible to adjust the carrier flooding in the diode operation mode as well as the current/voltage characteristic as known in freewheeling diodes, without the p-type compensation zones 12 having a significant effect on carrier flooding. A further property in diode operation mode is that most of the load current flows via the highly flooded compensation region II, so that carrier flooding may be optimized in region I without having to take account of forward losses in diode operation mode.

In MOSFET operation mode, most of the load current flows via the compensation regions II, increasing the on-state resistance of the compensation semiconductor device 1 compared to conventional compensation semiconductor devices of the same surface area without homogeneously doped regions I. The p-type doping regions at the chip surface of region I can therefore be optimized with regard to the requirements of diodes without any significant adverse effects on the behavior of the MOSFET, and they can typically be doped lightly and designed without any source and channel regions. A typical arrangement of a p-type doping region on the front side of the chip and a field stop arrangement which may be provided in place of or in addition to the base region 19 are for example described in German Patent DE 100 31 461 (incorporated by reference herein) and may be used here in an analogous manner.

Thus, a minimum increase in on-state resistance compared to a conventional semiconductor device while still improving the diode behavior is achieved. For this purpose, the region I is typically arranged below the edge termination, where little, if any, current flows as the MOSFET is switched on. The area proportion of the region I should be limited to a value essential for the required switching behavior.

The charge carrier storage region 14 may therefore provide sufficient flood charges to ensure a soft switch-off of a compensation semiconductor device structure of this design. An optional thick carrier substrate made of a semiconductor wafer is not illustrated in the drawing, nor are the planar or trench cells required for a complete MOS field effect transistor or a bipolar IGBT. The charge carrier storage region 14 illustrated in FIG. 3 does not necessarily have to be free of slightly more highly doped drift zone material. As FIG. 4 illustrates, a section of the charge carrier storage region 14 may contain more highly doped drift zone columns of the same conductivity type.

A method for producing a plurality of compensation semiconductor device chips, which allows for a highly homogeneous column shape in the vertical region, may include the following processes. In a first process, a semiconductor wafer of a first conductivity type and with a dopant concentration which is higher than that of drift zones 13 is provided, the semiconductor wafer forming a base material 19 of a compensation semiconductor device chip region. To the semiconductor wafer is then applied an epitaxial layer, typically in one process or alternatively in several processes, on the base material 19, the epitaxial layer 23 being doped less highly than the base material 19 and the drift zones 13.

Column-shaped structures are etched into the epitaxial layer by anisotropic etching. A material containing a first conductivity type—in the illustrated embodiment a donator—is then applied at least on the inner side of the etched structures, and a defined amount of the first conductivity type, for example phosphorus as donator, is diffused into the surrounding semiconductor material, for example in an oven process. As an alternative, the donator may be in the gas phase and diffused into the semiconductor material from this phase. After the material applied to the surface has been removed, for example by etching or by the exchange of the gas atmosphere, and possibly following the further diffusion of the donator material into the semiconductor body and the formation of the substantially cylinder barrel-shaped drift zones 13, a material containing a second conductivity type complementary to the first conductivity type—in the illustrated embodiment an acceptor—is likewise applied at least on the inner side of the etched structures, and a defined amount of the second conductivity type, for example boron as acceptor, is diffused into the surrounding semiconductor material. Following the removal of the material containing the acceptor, the remaining etched structures are filled, for example using insulators or typically epitaxially deposited, lightly doped silicon. This results in substantially column-shaped or cylinder barrel-shaped charge compensation zones 12.

In one embodiment, an ion implantation process is used to apply the material containing the first conductivity type and/or the material containing the second conductivity type on the etched structures.

In a further embodiment, the material containing the first conductivity type and/or the material containing the second conductivity type are/is introduced by isotropic deposition of source layers of the material containing the first conductivity type and/or the material containing the second conductivity type from the gas phase. The source layers may in particular consist of a doped glass, of the semiconductor material, or directly of a gas containing the doping material, such as diborane or phosphine.

Instead of the pre-loading with a material containing an acceptor, the acceptor may be applied in the silicon epitaxial process used for filling the etched structures, in order to form substantially column-shaped charge compensation zones 12.

The charge carrier storage regions 14 therefore are arranged in regions of the semiconductor body where there are no column-shaped etched structures over a large area.

This creates the basic structure in the semiconductor body as illustrated in FIGS. 2 and 3. One task remaining is the structuring of the semiconductor wafer or the epitaxial layer to form compensation semiconductor device chips with at least one charge carrier storage region 14, with at least one front-sided cell region 28 and with at least one anode region 27 and with a drift region 11 with the column-shaped drift zones 13 and the charge carrier compensation zones 12. Further, at least two electrodes, i.e. a first electrode 9 on a front-sided surface 24 of the compensation semiconductor device chip and a second electrode 10 on a back-sided surface 25 of the compensation semiconductor device chip, are applied as illustrated in FIG. 2.

In all semiconductor devices, in particular in the semiconductor devices illustrated in FIGS. 4 and 8, the base region 19 may be omitted, so that the charge compensation zones 12 and the drift zones 13 as well as the back-sided structures of the charge carrier storage region 14 extend to a substrate 26 provided by the semiconductor wafer or to a connection doping to the second electrode 10.

FIG. 4 illustrates a diagrammatic vertical section through a semiconductor device 2. Components of the same function as in the preceding figures are identified by the same reference numbers and not explained again. This figure is also a simplified illustration and does not illustrate all of the details of a final structure of a MOS field effect transistor. It differs from the preceding embodiment in that a section 23a of the epitaxial layer 23 of the semiconductor body 7 includes in the charge carrier storage region 14 columns of the same conductivity type but with higher doping obtained by providing a more highly doped drift zone material in the form of drift zone columns 18 introduced in the lower region of the charge carrier storage region 14 directly on the base region 19 or directly on the substrate 26, respectively.

To implement such a structure, a multiple epitaxial process with at least two—for example three to six or more—epitaxial processes is typically used, wherein the drift zone columns 18 arranged in the charge carrier storage region 14 can be introduced in the first process. The production method differs from the embodiments illustrated in FIGS. 2 and 3 in that an epitaxial layer can be applied to the base material 19 in several processes, the epitaxial layer 23 including a cell region with drift zones 13 doped with dopants of a first conductivity type and substantially parallel charge compensation zones 12 doped with dopants of a second conductivity type complementary to the first conductivity type, wherein a device region, for example an edge region, is formed with a charge carrier storage region 14 doped more lightly than the drift zones 13 and the base material 19.

In the first processes of this multiple epitaxial process, the drift zone columns 18 illustrated in FIG. 4 may be introduced in the charge carrier storage region 14 in the way described above by doping etched structures. Alternatively, the more highly doped column-shaped regions may be introduced in the charge carrier storage region 14 by providing dot- or line-shaped doping openings in the lower region of the charge carrier storage region 14, through which dopants of the first conductivity type—in the illustrated embodiment donators—can be introduced; these can be diffused together in the subsequent process steps. This further base doping can be varied across the thickness of the device without incurring any further costs simply by adjusting the size of the doping openings.

FIG. 5 illustrates a diagrammatic top view of a semiconductor device 3. This top view illustrates the structure of a front-sided surface 24 with a first electrode 9 as source electrode of a compensation semiconductor device 3 and with a third electrode 21 in the form of a gate electrode 22 insulated from the first electrode 9, FIG. 5 illustrating only the connection region of the front-sided electrodes. Using a switching potential at the gate electrode 22, a gating is possible via cell regions not illustrated in FIG. 5 between the first electrode 9 on the front-sided surface 24 and a second electrode not illustrated in the drawing, which is located on the back-sided surface of the semiconductor device 3.

In order to create a sufficiently large charge carrier storage region 14, the entire edge region 16 of the semiconductor device is built up with a doping significantly lower than the doping of the drift zones, and in addition the region below the connection region of the third electrode 21 is provided for the charge carrier storage region 14 and identified by the letter I. The region below the connection region of the third electrode 21 is arranged in a cell region 15 of the semiconductor device 3, the cell region 15 being at least partially surrounded by the edge region 16. The cell region 15 further includes a compensation region II with column-shaped drift zones and charge compensation zones as illustrated in FIG. 3, wherein the homogeneously doped semiconductor region I holds a flood charge sufficient to ensure a soft switching behavior of the semiconductor device in a commutation process. In a non-illustrated embodiment, the homogeneously doped semiconductor region I is arranged only in the edge region. This embodiment of the semiconductor device therefore includes a charge carrier storage region arranged only in the edge region.

If the region I as illustrated in FIG. 5 is not large enough, charge compensation zones may be omitted in the cell region at various points as illustrated in FIG. 6. FIG. 6 illustrates a diagrammatic top view of a semiconductor device 4. Components of the same function as in the preceding figures are identified by the same reference numbers and not explained again. In this embodiment, the compensation semiconductor device 4 includes additional charge carrier storage regions 14 in the cell region 15, which are identified by the letter I, whereby the area of the compensation region II of this semiconductor device 4 is reduced.

FIG. 7 illustrates a vertical section through a semiconductor device 5. Components of the same function as in the preceding figures are identified by the same reference numbers and not explained again. The embodiment according to FIG. 7 includes on the more highly doped base region 19 partially a charge carrier storage base 20 of the same conductivity type as but less highly doped than the column-shaped drift zones 13 which surround respective charge compensation zones 12, thus forming charge compensation zone columns 17 with surrounding drift zone columns 18.

Such a structure can be produced using the multiple epitaxial process, with homogeneous doping provided in the charge carrier storage base region 20 and with the drift regions 11 illustrated in the preceding figures and the parallel charge compensation zones 12 and drift zones 13 being introduced in the further epitaxial regions 23b and 23c. The base region 19 may be placed above a very highly doped substrate 26.

FIG. 8 illustrates a vertical section through a semiconductor device 6. This embodiment differs from the embodiment illustrated in FIG. 7 in that the charge carrier storage base region 20 contains regions with the dopant concentration of the drift zones 13. This can be implemented by providing dot- or line-shaped doping openings in the lower region of the base, through which donators are introduced which can diffuse together in the subsequent process steps, and this additional doping of the charge carrier storage base can be varied without incurring any additional costs by adjusting the size of the doping openings.

A common feature of the semiconductor devices described above is a charge carrier storage region which is at least partially free of charge compensation zones. In all embodiments, the charge carrier storage region may include both charge compensation zones and structures similar to a part of a drift zone column. In all of the semiconductor devices described above, the net doping of the charge carrier storage region is a doping of the first conductivity type which is lower than the doping of a drift zone column. In addition, a doping of the second conductivity type complementary to the first conductivity type, which may be present in the charge carrier storage region, has a concentration with a maximum lower than in the charge compensation zones, typically lower than a few $10^{15}$ cm$^{-3}$.

In a non-illustrated embodiment, the semiconductor device includes a charge carrier storage region wherein very fine regions of a doping of the second conductivity type complementary to the first conductivity type are arranged. Owing to their fine structure, these regions have a lower maximum dopant concentration after a diffusion process. Adjacent to these regions, the charge carrier storage region includes regions with a doping of the first conductivity type. As a whole, this results in a net dopant concentration in the charge carrier storage region which is lower than the doping of a drift zone column.

The net dopant concentration in the charge carrier storage region may for example be in a range between $10^{14}$ cm$^{-3}$ and $10^{16}$ cm$^{-3}$, typically in a range between $5 \cdot 10^{14}$ cm$^3$ to $5 \cdot 10^{15}$ cm$^{-3}$.

The semiconductor devices described above may be unipolar semiconductor devices such as MOSFETs or bipolar semiconductor devices such as IGBTs.

Apart from the possibilities of a soft recovery behavior for a circuit component as described above, it is also possible to reduce the lifetime of the charge carriers until the ambipolar diffusion length becomes significantly shorter than the distance between two p-type compensation columns. In this case, carrier flooding in the compensation region is noticeably reduced in diode operation mode. In a commutation process, these flood charge carriers are removed very fast. If a suitably strong n-type back side emitter is present, carrier flooding in the base is sufficiently high to store an adequate amount of charge carriers in the base to ensure a soft recovery behavior as in the preceding examples, even if a depletion region is already built up in the compensation region. If carrier lifetime is too long, i.e. the ambipolar diffusion length has the same order of magnitude as half the spacing of the p-type compensation columns or more, too much charge carriers are removed upstream of the cathode—a known feature of diodes—before the depletion region is built up in the region of the p-type compensation columns. These charge carriers are then missing for a soft recovery behavior.

In view of this, simulation tests provided an optimum setting, wherein the distance $a_{LK}$ between two p-type compensation columns is in the order of magnitude of 8 μm (microns) and the adjusted ambipolar diffusion length $l_D$ is less than approximately 1 μm to 2 μm, i.e. the relation $l_D \leq 0.25 \cdot a_{LK}$ applies, for which purpose in the case of a spacing of 8 μm an ambipolar carrier lifetime of less than approximately 0.5 ns to 1 ns (nanoseconds) is required. If this short lifetime is to be obtained by an indiffusion of heavy metal atoms, for example platinum atoms, approximately $2 \cdot 10^{15}$ to $4 \cdot 10^{15}$ platinum atoms/cm$^3$ on silicon lattice sites are required for 0.5 ns to 1 ns carrier lifetime. The required lifetime doping can be obtained using a suitable diffusion process at approximately 950° C. to 1100° C. An increased carrier scattering at the lifetime doping, however, also reduces the carrier mobility of the electrons, which may increase the on-state resistance.

In addition to the embodiments referred to above, the following is possible. Instead of the monolithic integration of different MOSFET regions, these MOSFETs may in a further embodiment be connected in parallel either on a lead frame as a chip-by-chip product or on a printed circuit board as discrete components. Instead of the soft MOSFET, a conventional fast-switching diode can be mounted on the lead frame or printed circuit board in order to make the soft switching behavior possible. The embodiment with the diode mounted as a chip-by-chip product in a housing corresponds to known DuoPacks in IGBTs, but in contrast to these IGBTs, a significant diode current may flow through the MOSFET.

The embodiments described above can in principle be used individually or combined to obtain a plurality of modifications and embodiments.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
   a semiconductor body with a semiconductor device structure including a first electrode and a second electrode;
   a drift region for charge carriers between the two electrodes, including charge compensation zones and drift zones arranged substantially parallel to one another;
   wherein at least one charge carrier storage region which is at least partially free of charge compensation zones is arranged in the semiconductor body.

2. The semiconductor device of claim 1, wherein the charge carrier storage region has the same conductivity type as the drift zones and a lower net dopant concentration than the drift zones.

3. The semiconductor device of claim 1, further comprising a cell region and an edge region, wherein the drift region is at least partially arranged in the cell region and wherein the charge carrier storage region is arranged in the edge region.

4. The semiconductor device of claim 1, wherein the charge carrier storage region is arranged in the drift region.

5. The semiconductor device of claim 3, wherein the charge carrier storage region is arranged in the cell region and in the edge region.

6. The semiconductor device of claim 1, wherein the drift region includes column-shaped vertical charge compensation zones and drift zones, and wherein each charge compensation zone column is surrounded by a drift zone column, and wherein between the drift zone columns the charge carrier storage region with a net dopant concentration lower than that of the drift zone columns is arranged.

7. The semiconductor device of claim 1, further comprising a charge carrier storage base including column- or strip-shaped drift zone material, the drift zone material being adjoined towards the first electrode by a charge carrier storage region with a lower net dopant concentration than the drift zone material.

8. The semiconductor device of claim 1, further comprising a charge carrier storage base including column- or strip-shaped drift zone material, which is adjoined towards the first electrode by a drift region with drift zones and charge compensation zones.

9. The semiconductor device of claim 1, further comprising a charge carrier storage base of the same conductivity type as the drift zones and with a lower dopant concentration than the drift zones, which is adjoined towards the first electrode by a drift region.

10. The semiconductor device of claim 1, further comprising a base towards the second electrode, the base having the same conductivity type as the drift zones and a higher dopant concentration than the net dopant concentration of the drift zones and the charge compensation zones, and wherein a charge carrier storage base is arranged on a section of the base.

11. The semiconductor device of claim 1, further comprising a third electrode providing a gate electrode, wherein the charge carrier storage region is arranged below a connection region of the gate electrode.

12. The semiconductor device of claim 11, wherein the charge carrier storage region is arranged below a connection region of the gate electrode and/or in an edge region of the semiconductor device.

13. The semiconductor device of claim 1, wherein the semiconductor device is a semiconductor device selected from the group consisting of a MOSFET, an IGBT and a MOS diode.

14. A semiconductor device comprising:
    a semiconductor body with a semiconductor device structure including a first electrode and a second electrode;
    a drift region for charge carriers between the two electrodes, including charge compensation zones and drift zones arranged substantially parallel to one another;
    wherein the charge carrier lifetime in the semiconductor body is reduced such that the ambipolar diffusion length $l_D$ of the charge carriers is, at least in the charge compensation zones and in the drift zones, $l_D \leq 0.25 \cdot a_{LK}$ relative to the distance $a_{LK}$ between two charge compensation zones.

15. A semiconductor device comprising:
    a semiconductor body with a semiconductor device structure including a first electrode and a second electrode;
    a drift region for charge carriers between the two electrodes, including charge compensation zones and drift zones arranged substantially parallel to one another;

wherein at least one charge carrier storage region which is at least partially free of charge compensation zones is arranged in the semiconductor body; and wherein the semiconductor device includes on a lead frame a chip-by-chip product or on a printed circuit board a parallel connection of discrete components with a transistor chip or transistor component selected from the group consisting of an IGBT and a MOSFET and a parallel-connected diode chip or diode component.

* * * * *